United States Patent [19]

Nakagawa et al.

[11] Patent Number: 4,719,501

[45] Date of Patent: Jan. 12, 1988

[54] SEMICONDUCTOR DEVICE HAVING JUNCTION FORMED FROM TWO DIFFERENT HYDROGENATED POLYCRYSTALLINE SILICON LAYERS

[75] Inventors: Katsumi Nakagawa, Tokyo; Toshiyuki Komatsu, Yokohama; Yutaka Hirai, Tokyo; Yoshiyuki Osada, Yokosuka; Satoshi Omata; Takashi Nakagiri, both of Tokyo, all of Japan

[73] Assignee: Canon Kabushiki Kaisha, Tokyo, Japan

[21] Appl. No.: 815,113

[22] Filed: Dec. 26, 1985

Related U.S. Application Data

[63] Continuation of Ser. No. 453,158, Dec. 27, 1982, abandoned.

[30] Foreign Application Priority Data

| Jan. 6, 1982 [JP] | Japan | 57-807 |
| Jan. 6, 1982 [JP] | Japan | 57-808 |
| Jan. 6, 1982 [JP] | Japan | 57-809 |

[51] Int. Cl.[4] .......................................... H01L 29/04
[52] U.S. Cl. .......................................... 357/59; 357/2; 357/61; 357/30; 357/4; 430/84
[58] Field of Search ............. 357/4, 61, 15, 30, 30 R, 357/54 A, 59 A, 59 D, 59 E, 59 R, 2, 31, 32; 430/84

[56] References Cited

U.S. PATENT DOCUMENTS

| 4,425,379 | 1/1984 | Vora et al. .......................... 357/15 X |
| 4,434,318 | 2/1984 | Gibbons ............................. 357/30 X |
| 4,613,382 | 9/1986 | Katayama et al. ................. 357/59 D X |
| 4,625,224 | 11/1986 | Nakagawa et al. ................ 357/59 E X |

FOREIGN PATENT DOCUMENTS

2029642  3/1980  United Kingdom ............ 357/59 A

OTHER PUBLICATIONS

Viktrovitch et al., "Diodes Schottky et MIS Tunnelsur Silicium Amorphe Hydrogéné de Qualité Photovoltaique Préparé par Pulvérisation Cathodique Caractérisation Électrique par Mesures Capacitives," *Revue de Physique Appliquee*, vol. 14, Jan. 1979, pp. 201–208.

Fan et al., "Proposed Design of a -SiiH Solar Cells Using Ultrathin Active Layer to Increase Conversion Efficiency," *Fourteenth IEEE Photovoltaic Specialists Conference*, 1980, San Diego, Calif., U.S.A., Jan. 7–10, 1980, pp. 1070–1073.

Campbell, "Enhanced Conductivity in Plasma-Hydrogenated Polysilicon Films," *Appl. Phys Lett.*, 36(7), Apr. 1, 1980, pp. 604–606.

Kamins et al., "Hydrogenation of Transistors Fabricated in Polycrystalline-Silicon Films," *IEEE Electron Device Letters*, vol. EDL-1, No. 8, Aug. 1980, 159–161.

*Primary Examiner*—Martin H. Edlow
*Assistant Examiner*—William A. Mintel
*Attorney, Agent, or Firm*—Fitzpatrick, Cella, Harper & Scinto

[57] ABSTRACT

A semiconductor element is mainly composed of a polycrystalline Si thin film layer containing 0.01–3 atomic %, and further having a maximum surface unevenness of substantially not more than 800 Å and/or a particular range of etching rate when etched with a predetermined etchant.

8 Claims, 6 Drawing Figures

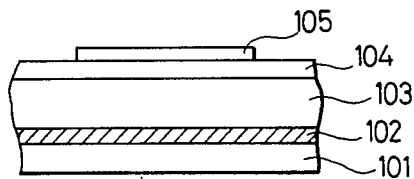
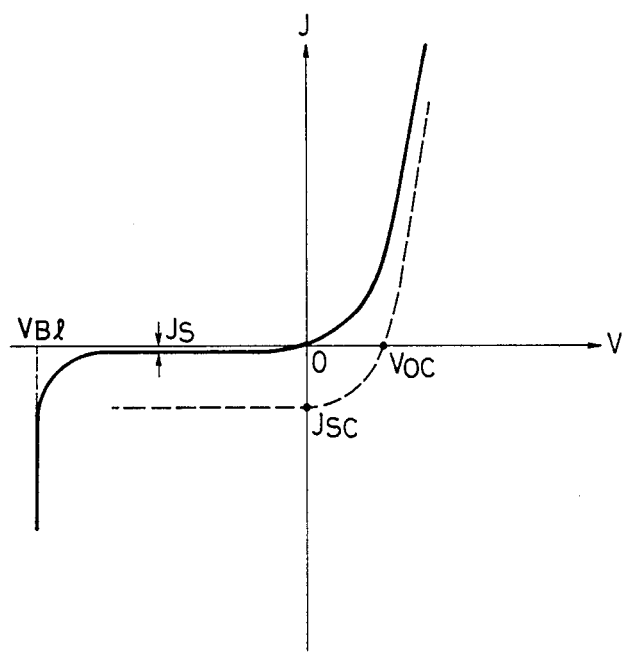

SEMICONDUCTOR DEVICE HAVING JUNCTION FORMED FROM TWO DIFFERENT HYDROGENATED POLYCRYSTALLINE SILICON LAYERS

This application is a continuation of application Ser. No. 453,158 filed Dec. 27, 1982, now abandoned.

BACKGROUND OF THE INVENTION

1. Field of the Invention

This invention relates to a semiconductor element provided with a junction made by laminating a second layer to a first thin layer. More particularly, to a semiconductor element having an electric junction the main part of which is formed from a polycrystalline silicon thin film semiconductor layer of high performance characteristics, reliability and stability.

2. Description of the Prior Art

Recently, the formation of a scanning circuit portion of an image reading device for use in image reading such as a one-dimensional photosensor made in a continuous length or a two-dimensional photosensor of an enlarged area, has been the subject of research. The formation of a driving circuit of an image display device utilizing liquid crystal (abbreviated as LC), electrochromic material (abbreviated as EC) or electroluminescence material (abbreviated as EL), and the formation of a light receiving element member of the photosensor and a switching circuit for the display device, has been investigated. It has been proposed to use a silicon thin film formed on a certain substrate as a fabrication material, corresponding in size to the increased area of such display portions.

Such a silicon thin film is preferably polycrystalline rather than amorphous for realization of a large scale image reading device or image display device improved speed and function. This is so despite the requirement that the effective carrier mobility ($\mu$eff) of a silicon thin film, for example, a field effect transistor, as the base material for forming a light receiving portion and a scanning circuit portion of such a high speed, high function reading device or switching portion and driving circuit portion of image display device should be large. The $\mu$eff of the amorphous silicon thin film obtained by an ordinary discharge decomposition method is at most 0.1 cm$^2$/V.sec. In addition, as DC voltage is applied to the gate, the drain current decreases and the threshold voltage of the transistor changes. Such changes after a period of time are signifcant and the stability of the device is poor.

In contrast, a polycrystalline silicon thin film has an effective carrier mobility, $\mu$eff, far greater than an amorphous silicon thin film as is seen from the practical data as measured. Theoretically, it is quite probable that there can be prepared a polycrystalline silicon thin film having a further increased value of mobility $\mu$eff beyond than that presently obtained.

However, at present the elements or devices produced by using polycrystalline silicon thin film as a base material according to various methods do not sufficiently exhibit the desired characteristics and reliability.

SUMMARY OF THE INVENTION

The present inventors have succeeded in obtaining semiconductor elements having excellent semiconductor element characteristics, reliability, reproducibility, and stability with lapse of time. The basis of this discovery is that many semiconductor elements have electric junctions (PN junction, MIS junction and the like) in a laminate structure, and the characteristics of the junction interface and reliability determine the performance of the element and the reliability.

In other words, in semiconductor elements having an electric junction the controlled movement of carriers (electrons and holes) is directed to a direction perpendicular to the laminated interface, and it may be expected that the characteristics at the junction interface and in the vicinity of the interface considerably affect the characteristics of the element. Based on this discovery, the present inventors have found that the polycrystalline silicon layer should have a particular surface shape, composition and structure so as to make the characteristics at the junction interface or in the vicinity of the interface produced by lamination practically durable and reliable.

Firstly, the present invention is based on the discovery that the hydrogen atom (H) content in the silicon thin film and unevenness of the silicon thin film surface determine the function and reliability of the element in the polycrystalline silicon thin film semiconductor element having an electric junction.

In particular, the present invention is based on the discovery that, during the formation of a semiconductor element having an electric junction by laminating thin films using conventional polycrystalline silicon thin films as a base material, the polycrystalline silicon thin films have a significant uneven surface and are non-uniform. These factors adversely affect the characteristics of the element such as carrier mobility and carrier life time. The yield is also lowered by the electric leak of the element, and the performance changes with lapse of time and the fluctuation of the elements is large.

In addition, the present inventors have found that a certain amount of hydrogen contained in a polycrystalline silicon thin film improves the characteristics of the semiconductor element and decreases fluctuation of the element resulting in enhanced practicality of the elements. Further the present inventors have found that orientation and average crystal grain size of the polycrystalline thin film effects the device's characteristics and such characteristics may be improved by selecting appropriate values for grain size.

Secondly, the present inventors have found that, in polycrystalline silicon thin film semiconductor elements having an electric junction, the hydrogen atom (H) content in the thin film and the etching rate when the polycrystalline silicon film formed is etched with a particular etching solution determine the performance and reliability of the elements.

More particularly, the present inventors have found that, to improve the characteristics of semiconductor elements (carrier mobility, carrier life time, change with lapse of time and the like) and to decrease fluctuation of the elements that the polycrystalline silicon thin film should contain a certain range of hydrogen and the etching rate when the polycrystalline silicon film is etched with a particular etching solution, should be lower than a certain critical value.

In addition, the present inventors have found that the above mentioned characteristics can be improved by selecting a particular orientation and average crystal grain size of polycrystalline thin film.

An object of the present invention is to provide a junction type semiconductor element having a polycrystalline silicon thin film semiconductor layer of high efficiency.

Another object of the present invention is to provide a semiconductor element of high efficiency, reliability and stability having a junction formed by laminating thin layers produced by using a polycrystalline silicon thin film semiconductor layer formed on a substrate.

A further object of the present invention is to provide a large area semiconductor device formed from a semiconductor device having a junction formed by laminating thin layers by using the inventive polycrystalline silicon thin film semiconductor layer.

According to one aspect of the present invention, there is provided a semiconductor element which comprises a first polycrystalline silicon thin film layer containing 0.01-3 atomic % of hydrogen atom and having a surface unevenness of substantially not more than 800 Å at its maximum, and a member selected from the group consisting of a polycrystalline silicon thin film layer having an electroconductivity type different from that of said first polycrystalline silicon thin film layer, a metal layer capable of forming Schottky barrier junction, and an oxide layer, said member being laminated to said first polycrystalline silicon thin film layer to form an electric junction.

According to another aspect of the present invention, there is provided a semiconductor element which comprises a first polycrystalline silicon thin film layer containing 0.01-3 atomic % of hydrogen atom and having an etching rate of 20 Å/sec or less by etching with an etchant comprising a mixture of hydrofluoric acid (50 vol. % aqueous solution), nitric acid (d=1.38, 60 vol. % aqueous solution) and glacial acetic acid at a mixing ratio by volume of 1:3:6, and a member selected from the group consisting of a polycrystalline silicon thin film layer having an electroconductivity type different from that of said first polycrystalline silicon thin film layer, a metal layer capable of forming Schottky barrier junction, and an oxide layer, said member being laminated to said first polycrystalline silicon thin film layer to form an electric junction.

According to a further aspect of the present invention, there is provided a semiconductor element as set forth in each of the previous embodiments in which the first polycrystalline silicon thin film layer has an X-ray diffraction pattern or an electron beam diffraction pattern of which the diffraction strength at the (220) plane is 30% or more based on the total diffraction strength.

According to still another aspect of the present invention, there is provided a semiconductor element as set forth in each of the previous aspects in which the average crystal grain size of the first polycrystalline silicon thin film layer is 200 Å or more.

BRIEF DESCRIPTION OF THE DRAWINGS

FIG. 1 and FIG. 6 show preferable embodiments of the semiconductor element according to the present invention;

FIG. 2 shows an example of the V-J characteristics according to the present invention;

DETAILED DESCRIPTION OF THE PREFERRED EMBODIMENTS

Figure 3:
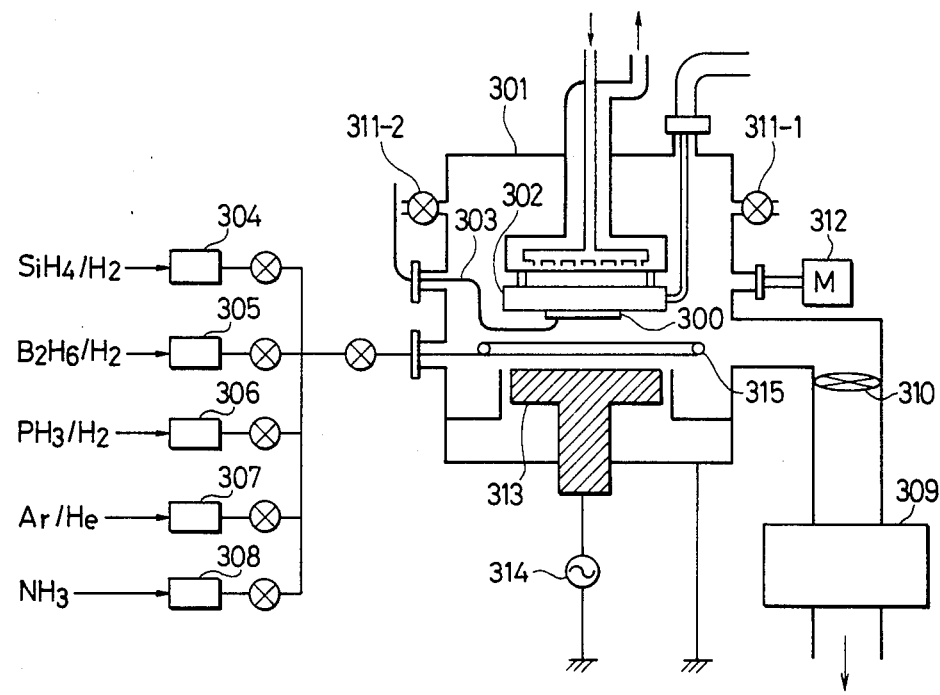
FIGS. 3, 4 and 5 schematically show apparatus for producing the semiconductor element according to the present invention.

As used herein, the terms "electric junction" typically means a PN junction, a Schottky junction and a junction with an oxide layer.

Firstly the present invention is explained with respect to a PN junction element as an embodiment of the present invention.

Referring to FIG. 1, to an electrode 102 formed on a substrate 101 there is laminated, for example, a polycrystalline silicon layer 103 of n-type and then a polycrystalline silicon layer 104 of p-type. In addition, an electrode 105 is formed on polycrystalline silicon layer 104 to produce an element having PN junction characteristics.

In this case, the contact between electrode 102 and the polycrystalline silicon layer 103 and the contact between electrode 105 and the polycrystalline silicon layer 104 are substantially ohmic contacts, and if desired, an n+ layer or a p+ layer may be introduced into the interface.

When a reverse bias is applied to the pn junction of the resulting pn junction element, a limited current flows. When a forward bias is applied to the pn junction, a large current flows to the forward direction (refer to FIG. 2).

The relation between the current density J and the applied voltage V is as shown below.

$$J = Jo\left\{ \exp\left(\frac{eV}{nkT}\right) - 1 \right\}$$

Jo is a saturated current density upon reverse bias, and n is a constant relating to a current produced by the influence of defects in the depletion layer formed at the pn junction and n is a value between 1 and 2. n=2 means that recombination current due to defects in the depletion layer is predominant and this is not a preferable pn junction characteristic.

The value of n is the reciprocal of the gradient of the line produced by plotting log (J/Jo) and (eV/kT).

It is preferred that a voltage $V_{BR}$ is sufficiently high such that upon reverse bias, a saturated current can not be retained and the breakdown of the junction occurs. The value of $V_{BR}$ is one standard for evaluating the junction. In addition, Jo is also an important value for evaluating the depletion layer formed at the junction portion.

Further, in the present invention, the pn junction element may be evaluated by the light diode characteristics, $V_{OC}$ and $J_{SC}$ (refer to the dotted line in FIG. 2), upon projecting a light to the pn junction surface for light exciting, a fill factor (FF) which is an evaluating means used in ordinary photovoltaic cells, efficiency ($\eta$), the change with lapse of time and the like.

When Schottky barrier junction elements, pn junction type field effect transistor elements, bipolar transistor elements of pnp or npn type, as well as the above mentioned pn junction elements are evaluated with respect to performance characteristics, stability, yield and the like by means of such evaluation method, the present invention is found to be excellent.

According to the present invention, various characteristics of elements can be improved by incorporating in a polycrystalline silicon thin film constituting a semiconductor layer which is a main portion of the semiconductor, hydrogen atoms in an amount of 0.01 atomic % or more based on the polycrystalline silicon thin film.

The hydrogen atoms (H) contained in the polycrystalline silicon thin film mainly exist at the grain boundary and are bonded to Si atoms in the form of Si-H. It is also expected that the bonding forms Si=H$_2$ and Si≡H$_3$ are present and further free hydrogen atoms are present. It seems that the change in characteristics time, and in particular, upon operating continuously is caused by such hydrogen atoms being contained in unstable forms. The present inventors have found that when the content of hydrogen in the polycrystalline silicon thin film layer is 3 atomic % or less, the characteristics of the element hardly deteriorate with the passage of time and can stably maintain the desired characteristics. However, when a pn junction is formed of laminated polycrystalline layers containing three atomic percent or more of hydrogen there are observed the following properties upon the passage of time; an increase in the value of n when forward bias and reverse bias are alternatively applied continuously; a lowering of photoelectric converting efficiency upon photovoltaic continuous action by light excitation; a reduction of response speed in photoelectric conversion, and the like.

In the present invention, the hydrogen content in the polycrystalline silicon thin film layer is 0.01-3 atomic %, preferably 0.05-2 atomic %, most preferably 0.1-1 atomic %.

Measurement of the hydrogen content in the polycrystalline silicon film as defined in the present invention was conducted by means of a hydrogen analyzer conventionally used in chemical analysis (Elemental analyzer Model-240, produced by Perkin Elmer Co.) when the content was 0.1 atomic % or more. In any case, 5 mg of a sample was charged in the holder of the analyzer, hydrogen weight was measured and the hydrogen content in the film was calculated in terms of atomic %.

Analysis of a trace amount less than 0.1 atomic % was conducted by means of a secondary ion mass spectrometer-SIMS-(Model IMS-3f, produced by Cameca Co.). A conventional procedure was followed in this analytical method. That is, for prevention of charge-up, gold was vapor deposited to a thickness of 200 Å on a thin film of the sample. Measurement was conducted under the conditions of an ion energy of primary ion beam of 8 KeV and a sample current of $5 \times 10^{-10}$ A, with a spot size of 50 μm in diameter and an etching area of 250 μm×250 μm, to determine the detection intensity ratio of H$^+$ ion relative to Si$^+$ ion, from which the hydrogen content was calculated in terms of atomic %.

According to the present invention, the maximum of the surface unevenness of the polycrystalline silicon thin film constituting the main part of the semiconductor element is made substantially 800 Å or less, and thereby characteristics of the pn junction can be stably exhibited and moreover, the characteristics, yield and reliability can be improved to a great extent.

A pn junction of a polycrystalline silicon thin film having an unevenness of the film surface exceeding 800 Å results in large n value and large Jo, and small beakdown voltage V$_{BR}$ upon reverse bias. These facts show that the unevenness of the surface of the two layers laminated which forms an interface produces many defects at a depletion layer formed by junction or in its vicinity and further the unevenness produces portions in which an electric field is concentrated and in which leak current flows. This may be inferred from the fact that the change with lapse of time upon repeated measurement of V-I and measurement of photovoltaic power corresponds to the degree of the unevenness. It has been also found that the defects due to the unevenness of the interface decrease the life time of carriers so that the efficiency (η) of the photovoltaic element is remarkably lowered.

It has been now found that in a polycrystalline silicon thin film having a surface unevenness exceeding at its maximum 800 Å, amorphous silicon deficient in crystalline orientation or minute crystal layer are grown in the vicinity of the substrate surface and, in the course of such growth, there occurs crystal grain growth expanding in shape of a fan in the direction of film growth to increase unevenness as shown by photographs of film cross-sections.

Accordingly, the junction characteristics of semiconductor elements comprising a polycrystalline silicon thin film having a surface unevenness exceeding at its maximum 800 Å are very poor as pn junction characteristics since the surface unevenness of the surface to be laminated to itself is poor. Also the characteristics of the initially growing layer on the surface to be laminated to is poor in its characteristics as a polycrystalline silicon layer.

The polycrystalline silicon thin film which is formed with the maximum of the surface unevenness of not more than 800 Å as disclosed in the present invention shows no marked difference in crystallinity and orientation characteristic in the direction of film thickness as the result of dense crystal growth from the substrate interface and can give also good junction characteristics.

It is preferable for elements having various junctions that the maximum of the surface unevenness of the polycrystalline silicon thin film is not more than 800 Å. Most preferably the maximum unevenness is not more than 500 Å.

In the present invention, measurement of the surface unevenness was conducted by means of a field radiation type scanning electron microscope (Model JFSM-30, produced by Nippon Denshi Co.) and it was determined from an image of 100,000×magnification of the surface cross-section of a polycrystalline silicon thin film with accelerated electrons under 25 KV incident on the surface obliquely.

In the present invention, the surface unevenness of a polycrystalline silicon thin film constituting a semiconductor layer forming the main part of a semiconductor element is made 800 Å or less over the entire surface region of the semiconductor layer which constitutes actually the element.

The etching characteristic defined as an important element to the present invention has been determined by utilizing a part of polycrystalline silicon thin films prepared under various conditions for measurement of the etching rate by etching at an etching temperature of 25° C. with an etchant as defined below. The remainder has been used for producing a pn junction element having the structure illustrated in, for example, FIG. 1 to measure the diode characteristics and photovoltaic characteristics. Thus, the etching characteristics necessary for the present invention have been determined by the resulting correlation between the etching rate and characteristics of the elements. The present inventors have found that the etching rate is a standard for evaluating a polycrystalline silicon thin film constituting the main part of the semiconductor element of the present invention, and is also an important quantity indicating the film quality and dense property of the film (correlated with electric characteristics, in particular, junction characteristics).

As the etchant, there may be employed a mixture comprising a hydrofluoric acid commercially available usually as a chemical for electronic industries (50 vol.% aqueous solution), nitric acid (d=1.38, 60 vol.% aqueous solution) and glacial acetic acid at a volume ratio of 1:3:6.

The etchant has an etching characteristic that the etching rate is 15 Å/sec. when a silicon wafer with $\rho=0.3$ Ω.cm was subjected to etching with this etchant at 25° C.

According to the present invention, the etching rate is 20 Å/sec. or less.

For example, in the case of pn junction elements, the n value is 1.1 or less and the change with lapse of time is hardly observed. As to the photovoltaic characteristics, the efficiency $\eta$ is 5% or more (AM1 light), and no change with lapse of time as to the efficiency $\eta$ and the speed of response to light is observed.

On the contrary, when a polycrystalline silicon having the etching rate higher than 20 Å/sec is used, the n value exceeds 1.1 and Jo is large. When the measurement of V-I is repeated in the dark, the efficiency of the photovoltaic characteristic decreases as the light irradiation time is increased.

In this way, seemingly the etching rate of the polycrystalline silicon film is mainly correlated with the density property of the film, and the junction interface and the vicinity of the interface of the less dense polycrystalline silicon film form defects to decrease the life time of carriers and trap the carriers resulting in lowering the stability of characteristics of the element.

Furthermore, the present inventors have found that the characteristics of the element, in particular, carrier mobility, carrier life time and the like are improved as the orientation at the (220) plane increases when the above mentioned conditions of the hydrogen content in and the surface unevenness of the polycrystalline silicon thin film, or the above mentioned conditions of the hydrogen content in and the etching characteristics are satisfied.

Crystallinity and orientation characteristics of polycrystalline silicon thin films depend on the film preparation method and the film preparation conditions.

In the present invention, as the method for examination of the orientation characteristics, X-ray diffraction and electron beam diffraction are performed in combination.

X-ray diffraction intensity of a polycrystalline silicon film prepared was measured by X-ray diffractometer produced by Rigaku Denki (copper tube bulb, 35 KV, 10 mA) and comparison was made. The diffraction angle $2\theta$ was varied from 20° to 65°, and diffraction peaks at plane indices of (111) plane, (220) plane and (311) were detected to determine their diffraction intensities.

Electron beam diffraction intensities were measured by JEM-100 V produced by Nippon Denshi Co., and respective diffraction intensities were determined similarly.

According to the ASTM card (No. 27-1977), in case of a polycrystalline silicon having no orientation at all, taking out only (220) from the planes in terms of (h, k, l) representation with large diffraction intensities of (111):(220):(311)=100:55:30, its ratio to the total diffraction intensities, namely diffraction density of (220)/(total diffraction intensity) is equal to about $(55/241)\times100 \neq 22.8$ (%).

With the use of this value as the standard, and orientation characteristic (220) with a greater value than the above percentage, especially 30% or more, can give further improved junction characteristics. At a value less than 30%, the change with lapse of time becomes undesirably greater.

Further, it has been also found that the junction characteristics, especially carrier mobility and carrier life time, can be improved by increasing the average grain size and satisfying the requirements of the hydrogen (H) content in the polycrystalline silicone thin film and its surface unevenness characteristic as specified above. The value of the average grain size was determined according to the conventionally used Scherrer method from the half-value width of the (220) peak in the X-ray diffraction pattern as described above. The effective carrier mobility can be increased particularly at an average grain size of 200 Å or more. Most preferably, an average grain size is 300 Å or more.

In the present invention, the characteristics of the polycrystalline silicon thin film constituting the main part of the semiconductor element can be restricted as described above according to various film preparation methods.

For example, it can be realized under the specific conditions according to the method in which silicon hydride such as $SiH_4$, $Si_2H_6$, etc., is deposited by the glow discharge decomposition (GD), the method in which sputtering is effected using a Si target in a gas containing $H_2$ (SP), the method in which Si is subjected to electron beam vapor deposition in a $H_2$ plasma atmosphere (IP), the method in which vapor deposition is conducted in a $H_2$ atmosphere under ultra-high vacuum (HVD method), as well as the method in which a polycrystalline silicon film formed by chemical vapor deposition (CVD) or low pressure CVD (LPCVD) is subjected to $H_2$ plasma treatment, and so on.

It is preferable that the layers of various elements, for example, pn, pin, pnp, npn, multiple layered structures such as thyristor, or $n^+$ layer and $p^+$ layer for forming ohmic contacts between the laminate structure and electrodes have the feature(s) of the present invention.

Controlling p, i, n, $n^+$ and $p^+$ of the polycrystalline silicon thin film may be effected by various known methods for doping with impurities. For example, the n type is produced by introducing into the Si matrix an atom of Group V of the Periodic Table such as P, As and the like at an activated state (pentavalence). The p type is produced by introducing an atom of group III such as B and the like. The amount of the impurity introduced can be strictly adjusted by controlling the film forming conditions.

The value of conductivity of the n type or p type can be controlled within the range of from the value of conductivity of the i type to a value which is larger than that of the i type by several places.

As shown in the following Examples, there may be used a polycrystalline silicon thin film of a desired electroconductivity. The lamination of the layers of these conductivity types or layers having different doping amount may form a junction such as a contact with a metal layer.

In the present invention, various contacts such as pn, pi, ni, $n^+n$, $p^+p$ and the like are referred to as "junction". To be specifically noted in the present invention, the polycrystalline thin film semiconductor layer formed by the GD method, the SP method, the IP method and the HVD method, so long as it is formed at a low temperature of 350° C. to 450° C. while satisfying the requirements of the hydrogen content and the surface unevenness characteristic, can give element characteristics comparable to a polycrystalline silicon film known in the art, as prepared by, for example, CVD or LPCVD (at 600° C. or higher) followed by $H_2$ plasma annealing, and also give stability and reliability, thus indicating directly usefulness of the present invention.

As disclosed in the present invention, the formation of a polycrystalline silicon thin film suited for the object of the present invention is possible particularly by carrying out glow discharging of a silicon hydride compound gas (GD), sputtering of silicon in $H_2$ atmosphere (SP), ion plating (IP), or ultra-high vacuum vapor deposition (HVD) at a substrate surface temperature of 500° C. or lower (in the range of about 350° C.). This fact is not only advantageous in uniform heating of the substrate or provision of a cheap substrate material of large area in preparation of a driving circuit or a scanning circuit covering over a large area for a large area device and light-receiving element and switching element, but also important in that it can satisfy the requirement to use a light-transmissive glass plate as a substrate for transmissive-type display device or in application of an image device such as in case of a photoelectric converting light-receiving element of the type in which light enters from the substrate side.

Accordingly, since the present invention can be practiced at lower temperature zones as compared with the prior art techniques, low melting glasses in general, heat-resistant plastics, etc., may also be used in addition to heat-resistant glasses such as high melting glasses, hard glass, and the like, heat-resistant ceramics, sapphire, spinel, silicon wafer, etc., conventionally used in the prior art.

As the glass substrate, there may be employed a regular glass having a softening point of 630° C., an ordinary hard glass having a softening point of 780° C., an ultra-hard glass having a softening point of 820° C. (JIS First grade ultra-hard glass), etc.

According to the present invention, the substrate temperature can be lower than the softening point of the substrate to be used, and therefore, the film can be formed on the substrate without deteriorating the substrate.

In examples of the present invention, there was primarily employed as the substrate glass Corning #7059 glass among the regular glasses (soda glasses) having relatively low softening points, but it is, of course, possible to use a quartz glass having a softening point of 1,500° C. as the substrate. However, from practical standpoint, the use of regular glasses is advantageous in preparation of thin film elements at low cost and over a large area.

By using the polycrystalline silicon thin film having the above mentioned characteristics as a base material, there can be produced various semiconductor elements, for example, diodes or bipolar transistors having various junctions formed by laminating polycrystalline silicon thin films having different electroconductivity types from each other such as pn, pin, pnp, npn junctions and the like, and in addition, junction type field effect thin film transistors with a good result.

Further, good semiconductor elements having a Schottky barrier junction produced by laminating a metal such as Pt, Au and the like can be obtained.

Furthermore, good semiconductor elements having an oxide layer capable of heterojunction such as ITO, $SnO_2$ and the like laminated to the polycrystalline silicon thin film can be obtained.

In addition, when polycrystalline silicon layers having the same electroconductivity type are connected to form an ohmic contact for contacting the electrode of a semiconductor element, good characteristics are obtained.

In the following Examples there are described formation of polycrystalline silicon thin films, production process of various elements and performance of the elements to explain the present invention in detail.

EXAMPLE 1

According to the procedure shown below, a polycrystalline silicon thin film was formed on an Mo film deposited on a Corning glass (#7059) and a pn junction element was prepared with the use of said thin film.

A Corning glass #7059 (120 mm × 120 mm, thickness: 0.7 mm) was lightly etched with a mixture of $HF/HNO_3/CH_3COOH$, washed with running water and dried, followed by forming an Mo film of 1500 Å thick by an electron beam deposition method to produce a substrate 300. The substrate 300 was fixed in close contact with the substrate heating holder 302 on the upper anode side in a bell-jar deposition chamber 301 as shown in FIG. 3. The bell-jar 301 was evacuated by means of a diffusion pump 409 to a background vacuum degree of $2 \times 10^{-6}$ Torr, followed by heating of substrate heating holder 302 to maintain the surface temperature of the substrate 300 at 350° C. Subsequently, $SiH_4$ gas diluted to 10 vol.% with $H_2$ gas [abbreviated as "$SiH_4(10)/H_2$"] was introduced at a flow rate of 5 SCCM by using a mass-flow controller 304, and $PH_3$ gas diluted to 100 vol. ppm with $H_2$ gas [abbreviated as "$PH_3(100)/H_2$"] was introduced at a flow rate of 25 SCCM by using a mass-flow controller 306 through a ring-shaped gas blowing inlet 315 into the bell-jar 301, and the inner pressure in the bell-jar was controlled to 0.03 Torr by means of an absolute pressure gage 312 by closing the main valve 310. After the inner pressure in the bell-jar 31 was stabilized, a high frequency field of 13.56 MHz was applied to the cathode electrode 313 by a power source 314 to excite glow discharge, and at that time, the voltage was 0.7 KV, the current 60 mA and the RF discharge power 20 W. The thickness of the resulting film was 800 Å, and when a ring-shaped gas blowing inlet was used, the fluctuation of the thickness was within ±10% in the case of a substrate of 120×120 mm in size.

The hydrogen content in the film thus produced was 2.0 atomic %. The maximum surface unevenness was 250 Å. On a resulting n+ type polycrystalline silicon thin film there was formed an n type polycrystalline silicon thin film of 5,000 Å thick in the same apparatus and under the same conditions as above except that $PH_3(100)/H_2$ was introduced at 2.5 SCCM and $SiH_4(10)/H_2$ was introduced at 5 SCCM. Further, in place of $PH_3(100)/H_2$ gas, there was introduced $B_2H_6$ gas diluted to 100 vol. ppm with hydrogen [abbreviated as "$B_2H_6(100)/H_2$"] at 5 SCCM and the same procedure was repeated to form a p type polycrystalline silicon thin film of 800 Å thick. Hydrogen contents in the n type and the p type polycrystalline silicon thin films thus laminated were 2.1 and 2.2 atomic %, respectively.

The maximum surface unevenness of the n type and that of the p type films were both 300 Å. On the p type polycrystalline silicon thin film there was formed an Al dot electrode (vacuum heating deposition, 1 mm$\phi$ in size, 1500 Å thick) to produce a pn junction semiconductor element. From the V-I characteristics between the Al electrode and the Mo electrode, n=1.07 and $V_{BR}$=30 V, and Jo was small. As a result, good diode characteristics were obtained. Even when the V-I was measured repeatedly, $10^4$ times, the V-I characteristic was not changed at all.

EXAMPLE 2

Following the procedures of Example 1, on Corning glass (#7059) there were formed subsequently n+ layer, n type polycrystalline silicon and p type polycrystalline silicon, and then an ITO (indium tin oxide) electrode was formed on the whole surface in the thickness of 2000 Å by sputtering followed by forming a dot electrode of 1 mm$\phi$ in size by photolithography. The resulting pn junction semiconductor element exhibited the same good diode characteristics as in Example 1.

Then, AM-1 (Air Mass-1; ~100 mW/cm$^2$) light was projected from the ITO electrode surface to measure the V-I characteristics. The results were $V_{OC}$=0.58 (V), $J_{SC}$=18.3 (mA/cm$^2$) and $\eta$=8.0 (%).

When the element was operated under the AM-1 light for 1000 hours to conduct photovoltaic action and there was not observed any change in V-I characteristics.

EXAMPLE 3

A Corning glass substrate 300 provided with an Mo layer prepared in the same manner as in Example 1 was fixed to the substrate heating holder 302 on the upper anode side in the bell-jar 301, and a polycrystalline silicon plate (not shown; 99.9999%) was placed on the electrode plate of the lower cathode 313 so as to face the substrate.

The bell-jar 301 was evacuated by the diffusion pump 309 to $2 \times 10^{-6}$ Torr, and the substrate heating holder 302 was heated to maintain the surface temperature of substrate 300 at 450° C. Then, PH$_3$(100)/H$_2$ gas was introduced into the bell-jar at 5 SCCM by the mass-flow meter 306, and further a mixture gas of Ar/He (5:95, volume ratio) was introduced into the bell-jar 301 at 50 SCCM by the mass flow meter 307, and the inner pressure of the bell-jar was set to 0.05 Torr by controlling the main valve 310.

After the inner pressure was stabilized, a voltage of 2.0 KV was applied to the lower cathode electrode 313 by the high frequency electric source 314 of 13.56 MHz to excite glow discharge between the polycrystalline silicon plate on the cathode 313 and the anode (substrate heating holder) 302. The RF discharge power (travelling wave power-reflection wave power) was 200 W. Under the above mentioned conditions there was formed an n+ polycrystalline thin film of 600 Å thick.

On the resulting n+ polycrystalline silicon layer there was formed an i (intrinsic) type polycrystalline silicon layer of 5000 Å thick by introducing a high purity hydrogen gas through the mass-flow meter 308 (In this case the H$_2$ was used in place of NH$_3$.) at 0.5 SCCM and further a mixture gas of Ar/He (5/95, volume ratio) through the mass-flow meter 307 at 50 SCCM into the bell-jar and conducting deposition at the inner pressure of the bell-jar of 0.05 Torr at RF power of 200 W. Then, B$_2$H$_6$(100)/H$_2$ gas was introduced through the mass-flow meter 305 and a mixture gas of Ar/He (5/95, volume ratio) was introduced through the mass-flow meter 307 at respective flow rate of 5 SCCM, and the deposition was carried out under the same conditions as above to deposit a polycrystalline silicon layer of 600 Å.

The hydrogen content and the maximum surface unevenness of the resulting n+, i, p+ layers were:

| n+ layer | 2,8 atomic %, 300Å |
|---|---|
| i layer | 0.2 atomic %, 400Å |
| p+ layer | 2.9 atomic %, 300Å |

Further, on the surface p+ layer of the resulting p-i-n junction there was formed a dot electrode of 1 mm$\phi$ in size of ITO to produce a pin junction semiconductor element.

In Table 1 there are shown hydrogen content, maximum surface unevenness, diode characteristic and photovoltaic characteristic when the flow rate of the high purity H$_2$ gas upon forming the i layer was varied between 0 and 50 SCCM.

TABLE 1

| Sample No. | A1-1 | A1-2 | A1-3 | A1-4 | A1-5 |
|---|---|---|---|---|---|
| H$_2$ flow rate (SCCM) | 0 | 0.1 | 0.5 | 5 | 50 |
| Content of H in the i layer (atomic %) | 0 | 0.01 | 0.2 | 3 | 6 |
| Maximum surface unevenness of the i layer (Å) | 350 | 350 | 400 | 400 | 500 |
| n | 1.1 | 1.04 | 1.03 | 1.05 | 1.2 |
| $V_{BR}$ (V) | 35 | 39 | 40 | 40 | 32 |
| $\eta$ (%) | 2.2 | 8.1 | 8.8 | 7.6 | 3.0 |
| $\Delta\eta$ (%) | 0 | 0 | 0 | 0 | −0.5 |

$\Delta\eta$ denotes the change quantity of the efficiency ($\eta$) after photovoltaic action for 1000 hour under irradiation of AM-1 light. [$\Delta\eta=\eta(0)-\eta(1000)$, where $\eta(0)$ and $\eta(1000)$ denote the initial efficiency and the efficiency after operated for 1000 hours].

From the above, it is clear that good diode characteristics and photovoltaic characteristics are obtained at a hydrogen content of 0.01-3 atomic %, and Sample A1-5 of a hydrogen content exceeding 3 atomic % is poor in the above mentioned two characteristics and the change with lapse of time is disadvantageously large.

Sample A1-1 of a hydrogen content less than 0.01 atomic % has poor characteristics.

EXAMPLE 4

Upon producing pn junction semiconductor elements following the procedure of Example 2, the gas pressure (Pr) was varied under the conditions of substrate temperature (Ts)=350° C., RF power=20 W and the flow rate conditions of SiH$_4$(10)/H$_2$, PH$_3$(100)/H$_2$ and B$_2$H$_6$(100)/H$_2$ being the same as those in Example 1. The results are shown in Table 2.

TABLE 2

| Sample No. | A2-1 | A2-2 | A2-3 | A2-4 | A2-5 |
|---|---|---|---|---|---|
| Pr (Torr) | 0.01 | 0.02 | 0.04 | 0.08 | 0.1 |
| H content in each of p and n layers (atomic %) | 1.7 | 1.9 | 2.0 | 2.3 | 2.4 |
| Maximum surface unevenness of | 150 | 200 | 300 | 800 | 1200 |

TABLE 2-continued

| Sample No. | A2-1 | A2-2 | A2-3 | A2-4 | A2-5 |
|---|---|---|---|---|---|
| p, n layers (Å) | | | | | |
| n | 1.03 | 1.03 | 1.04 | 1.06 | 1.1 |
| $V_{BR}$ (V) | 34 | 33 | 29 | 23 | 8 |
| $\eta$ (%) | 8.3 | 8.3 | 7.8 | 6.1 | 2.6 |
| $\Delta\eta$ (%) | 0 | 0 | 0 | 0 | −0.2 |

Sample A2-5 whose maximum surface unevenness of each of p layer and n layer exceeds 800 Å has poor diode characteristics and large change with lapse of time.

EXAMPLE 5

Upon producing pn junction semiconductor elements following the procedure of Example 2, the substrate temperature was 350° C., and gas flow rate and gas pressure (Pr) were the same as those in Example 1, and RF power (Po) was varied. The results are shown in Table 3.

TABLE 3

| Sample No. | A3-1 | A3-2 | A3-3 | A3-4 | A3-5 |
|---|---|---|---|---|---|
| Po (W) | 10 | 20 | 50 | 100 | 150 |
| H content in each of p and n layers (atomic %) | 1.9 | 2.0 | 2.1 | 2.1 | 2.3 |
| Maximum surface unevenness (Å) of p, n layers | 300 | 300 | 350 | 350 | 350 |
| (220) orientation (%) | 73 | 55 | 50 | 30 | 28 |
| n | 1.03 | 1.04 | 1.04 | 1.05 | 1.07 |
| $V_{BR}$ (V) | 30 | 33 | 30 | 29 | 27 |
| $\eta$ (%) | 8.9 | 8.0 | 7.3 | 6.5 | 4.9 |
| $\Delta\eta$ (%) | 0 | 0 | 0 | 0 | −0.1 |

Samples having (220) orientation more than 30% (except sample A3-5) exhibit good diode characteristics and lower change with lapse of time.

EXAMPLE 6

Upon producing pn junction semiconductor elements following the procedure of Example 2, the conditions for producing the polycrystalline silicon layer were the same as those in Example 1, and the time for growing the n layer was varied to form n layer thickness (d) of 1,000, 2,000, and 4,000 Å. The results are shown in Table 4.

TABLE 4

| Sample No. | A4-1 | A4-2 | A4-3 |
|---|---|---|---|
| d (Å) | 1,000 | 2,000 | 4,000 |
| Hydrogen content (atomic %) | 2.2 | 2.0 | 2.2 |
| Maximum surface unevenness (Å) | 220 | 250 | 300 |
| Average grain size (Å) | 170 | 200 | 350 |
| n | 1.09 | 1.05 | 1.04 |
| $V_{BR}$ (V) | 21 | 29 | 33 |
| $\eta$ (%) | 3.1 | 7.8 | 8.0 |
| $\Delta\eta$ (%) | −0.1 | 0 | 0 |

Samples having an average grain size of 200 Å or more have good diode characteristics and less change with lapse of time.

EXAMPLE 7

Figure 4:
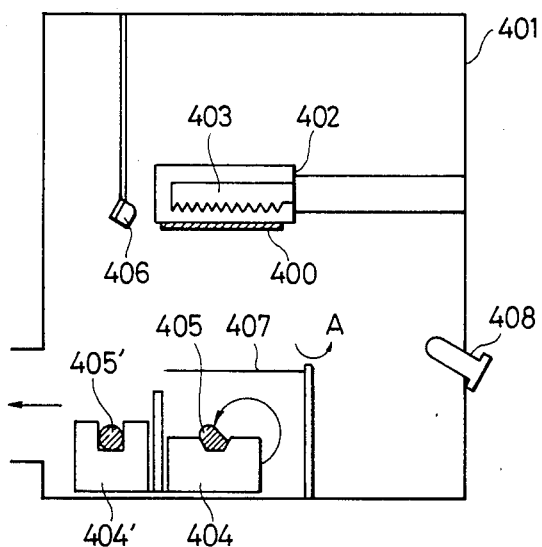

By using an ultra-high vacuum deposition apparatus illustrated in FIG. 4, a substrate 400 constituted of a Corning #7059 glass substrate provided with an Mo layer thereon as prepared in the same manner as in Example 1 was mounted on a substrate holder 402 in an ultra-high vacuum tank 401 which can be evacuated to $2 \times 10^{-11}$ Torr, and after reducing the pressure in the tank 401 to a pressure of lower than $2 \times 10^{-11}$ Torr, the substrate temperature was set to 400° C. by a tantalum heater 403.

Subsequently, an electron gun 404 (for evaporating silicon) was actuated at an acceleration voltage of 8 KV and the emitted electron beam irradiated the high purity silicon evaporating body 405 to evaporate silicon, simultaneously with evaporating phosphorus in a heating crucible 404' (for evaporating red phosphorus 405'). A shutter 407 was opened to the direction of A, and an n+ polycrystalline silicon layer was formed in the thickness of 1000 Å while controlling the film thickness by means of a quartz oscillator thickness meter 406. Then, shutter 407 was closed and crucible 404' was off and shutter 407 was closed again to form a polycrystalline silicon layer of 0.5μ this (Sample A).

On the other hand, in a similar way an n+ layer was formed on a Corning #7059 glass substrate provided with an Mo layer, and then the pressure in the vacuum tank 401 was reduced to $2 \times 10^{-10}$ Torr or less, followed by introducing a high purity hydrogen gas (99,9999%) by using a variable leak valve 408 into the vacuum tank 401 to set the pressure in the tank to $5 \times 10^{-7}$ Torr. The substrate temperature was set to 400° C. to form a polycrystalline silicon film of 0.5μ thick (Sample B).

A part of each of the resulting films was used to determine the hydrogen content and maximum surface unevenness while the remainder of the film was used and platinum (Pt) of 300 Å thick was deposited on each of the surfaces of Sample A and Sample B by vacuum electron beam deposition to produce an upper electrode.

Diode characteristics (n, $V_{BR}$) and photovoltaic characteristics ($\eta$, $\Delta\eta$) of the resulting Schottky diode cells (Sample A: AA5-1, Sample B: AB5-2) are shown in Table 5.

TABLE 5

| Sample No. | AA5-1 | AB5-2 |
|---|---|---|
| Hydrogen content (atomic %) | <0.01 | 0.3 |
| Maximum surface unevenness (Å) | 300 | 300 |
| n | 1.3 | 1.04 |
| $V_{BR}$ (V) | 34 | 38 |
| $\eta$ (%) | 1.3 | 7.7 |
| $\Delta\eta$ (%) | 0 | 0 |

As shown in Table 5, Sample AA5-1 containing little hydrogen exhibits a large n value, and the photovoltaic characteristic was poor while Sample AB5-2 containing 0.3 atomic % of hydrogen is excellent.

EXAMPLE 8

There is shown below a polycrystalline silicon pn junction type field effect transistor illustrated in FIG. 6 fabricated by using an ion plating deposition apparatus in FIG. 5.

First, in a deposition chamber 503 capable of being brought to a reduced pressure there was placed a nondoped polycrystalline silicon body to be evaporated 506 in a boat 507, and a Corning #7059 substrate was set on supports 511-1 and 511-2. After the deposition chamber was evacuated to a base pressure of about $1 \times 10^{-7}$ Torr, an $H_2$ gas containing 500 ppm of $B_2H_6$ [abbreviated as "$B_2H_6(500)/H_2$"] was introduced into the deposition chamber through a gas inlet tube 505 such that the hydrogen partial pressure $P_H$ became $3 \times 10^{-5}$ Torr. The gas inlet tube had an inner diameter of 2 mm and shaped at its tip in a loop having gas blowing openings of 0.5 mm in diameter at intervals of 2 cm.

Then, high frequency of 13.56 MHz was applied to a high frequency Coil 510 (5 mm in diameter) to set the output at 40 W and a high frequency plasma atmosphere was formed inside of the coil. On the other hand, while rotating the supports 511-1 and 511-2, the heating device 512 was actuated and the supports were heated to about 430° C.

Then, the evaporating body 506 was irradiated with an electron gun 508 to permit the heated silicon particles to fly.

The power of the electron gun was about 0.3 KW.

In this way, there was formed a p type polycrystalline silicon thin film 601 of 5000 Å thick. On the resulting p type polycrystalline silicon layer there was deposited an n type polycrystalline silicon layer of 800 Å thick under the similar conditions by introducing $H_2$ gas containing 2500 ppm [abbreviated as "$PH_3(2500)/H_2$"] into the deposition chamber such that the pressure became $3 \times 10^{-5}$ Torr.

The hydrogen content in the polycrystalline silicon thin film of the n type layer and the p type layer was 0.5 atomic %, and the maximum surface unevenness was 450 Å.

Then, Al electrodes for source 605-1 and drain 605-2 were produced by vacuum deposition and photoetching, and simultaneously, the n layer was separated at a predetermined width.

Then, the resulting member was fixed to the anode side heating holder 302 in the apparatus of FIG. 3. In the same way as in producing a polycrystalline silicon, bell-jar 301 was evacuated and the substrate temperature $T_S$ was made 250° C., and $NH_3$ gas and $SiH_4$ [$SiH_4(10)/H_2$] gas were introduced at 20 SCCM and 5 SCCM through mass-flow meters 308 and 304, respectively. Glow discharge was effected at 5 W to deposit an SiNH film 603 in the thickness of 2500 Å.

Then, an Al layer for gate electrode was deposited and subjected to photoetching again to form a gate electrode 604 between source and drain.

The resulting pn junction type field effect transistor (Sample No. ATA) is of N channel inversion type and acts very well, and the threshold voltage (Vth) of gate was as low as 5V, and further the current at $V_G=20V$ was larger than that at $V_G=0$ by three or more places (ON/OFF ratio).

The effective mobility of this element ($\mu$ eff) was $$2.2 \left( \frac{cm^2}{V \cdot sec} \right),$$

and during the continuous action at $V_G=V_D=40V$ there was not observed any change in drain current and threshold voltage for 500 hours.

For the purpose of comparing with the above mentioned example, Ar gas containing $PH_3$ and Ar gas containing $B_2H_6$ were used in place of $H_2$ gas containing $PH_3$ and $H_2$ gas containing $B_2H_6$ to produce a pn junction type field effect transistor (Sample No. ATB). Further, using $H_2$ gas containing $PH_3$ and $H_2$ gas containing $B_2H_6$ and elevating only the electron gun power to 0.8 KW to produce a pn junction type transistor (Sample No. ATC).

The characteristics of the sample are shown in Table 6.

TABLE 6

| Sample | ATA | ATB | ATC |
|---|---|---|---|
| H content in each of p and n layers (atomic %) | 0.5 | 0 | 0.7 |
| Maximum surface unevenness of each of p and n layers (Å) | 450 | 500 | 950 |
| Vth (V) | 5 | 18 | 6 |
| $\mu eff \left( \frac{cm^2}{V \cdot S} \right)$ | 2.2 | 0.3 | 0.4 |
| $\Delta I_D$ (%) after operating for 500 hours | 0 | 0 | −15 |
| ON/OFF ratio ($V_G$:2%) | $2 \times 10^3$ | $6 \times 10^2$ | $3 \times 10^2$ |

Sample ATB containing no hydrogen exhibits poor Vth and $\mu$eff, and small ON/OFF ratio. Sample ATC of a large maximum surface unevenness exhibits poor $\mu$eff and a large change with lapse of time during a continuous operation.

EXAMPLE 9

By the following steps, there was produced a pn junction semiconductor element by laminating a polycrystalline silicon thin film on an Mo deposited film on a Corning glass (#7059) substrate.

A corning glass #7059 (120 mm × 120 mm, 0.7 mm thick) was lightly etched with a mixture of $HF/HNO_3/CH_3COOH$, washed with a runing water, dried, and subjected to an electron beam deposition method to form an Mo film of 1500 Å thick resulting in formation of a substrate 300.

The substrate was fixed to a substrate heating holder 302 on the upper anode side in a bell-jar deposition chamber 301. Bell-jar 301 was brought to a vacuum state by a diffusion pump 309 to attain a background pressure of $2 \times 10^{-6}$ Torr, and then substrate heating holder 302 was heated to keep the surface temperature of substrate 300 at 450° C. Then, $SiH_4$ gas diluted with $H_2$ gas to 3 vol. % (abbreviated as "$SIH_4(3)/H_2$") was introduced at 5 SCCM using a mass flow controller 304, and $PH_3(100)/H_2$ gas was introduced at 10 SCCM through a mass flow controller 306 into bell-jar 301 by way of a ring-like gas blowing inlet 315.

The inner pressure in the bell-jar was controlled to 0.02 Torr by means of an absolute pressure gage 312 by closing the main valve 310. After the inner pressure in bell-jar 301 was stabilized, a high frequency electric field of 13.56 MHz was applied to a cathode electrode 313 by a power source 314 to excite a glow discharge. THe voltage was 0.7 KV, current 50 mA, and RF discharge power 20 W.

The film thickness of the resulting film was 800 Å and the thickness was distributed within the range of ±10% for the substrate of 120 × 120 mm in size.

Hydrogen content in the resulting film was 1.2 atomic %. The etching rate was 16 Å/sec.

On the resulting n+ type polycrystalline silicon thin film there was deposited an n type polycrystalline silicon thin film of 5000 Å thick under the same conditions as above except that PH$_3$(100)/H$_2$ was introduced at 1.0 SCCM and SiH$_4$(3)/H$_2$ was introduced at 5 SCCM.

Further, under the same conditions as above except that B$_2$H$_6$(100)/H$_2$ gas was introduced at 2.5 SCCM in place of PH$_3$(100)/H$_2$ gas, there was deposited a p type polycrystalline silicon thin film of 800 Å thick. The hydrogen contents in the laminated n type and p type polycrystalline silicon thin films were 1.2 and 1.3 atomic %, respectively.

The etching rate by the above mentioned etchant of each of the n type and p type layers was 16 Å/sec. On the resulting polycrystalline silicon thin film forming a pn junction, there was formed an Al dot electrode (vacuum heating vapor deposition, 1 mm $\phi$t, 1500 Å thick) and thereby a pn junction semiconductor element was produced.

The V-I characteristics between the Al electrode and the Mo electrode showed than n=1.03, V$_{BR}$=35 V, and Jo was small and the diode characteristics were good.

Even when V-I was measured repeatedly (10$^4$ times), the V-I characteristics were not changed.

EXAMPLE 10

In a way similar to Example 9, on an Mo film on Corning glass (#7059) there were formed an n+ layer and further an n type layer and still further p type polycrystalline silicon, and then ITO (indium tin oxide) electrode was formed on the whole surface in the thickness of 2000 Å by sputtering, followed by forming a dot electrode of 1 mm$\phi$ by photolithography.

The resulting pn junction cell exhibited the same good diode characteristics as in Example 9.

Subsequently, AM-1 (air mass −1; ∼100 mW/cm$^2$) light was projected to the cell from the ITO electrode surface to measure the V-I characteristics. There were obtained Voc=0.57 (V), Jsc=18.8 (mA/cm$^2$), and $\eta$=8.1 (%).

When the element was actuated under AM-1 light for 1000 hours to effect a photovoltaic action, and there was not observed any change in V-I characteristics.

EXAMPLE 11

According to the same procedures as in Example 10, there was produced a pn junction semiconductor element. Upon the preparation, the substrate temperature (Ts) was changed in the range of 200° C.–600° C., and RF power was 30 W, gas pressure was 0.02 Torr and flow conditions of SiH$_4$(3)/H$_2$, PH$_3$(100)/H$_2$ and B$_2$H$_6$(100)/H$_2$ were the same as in Example 9. The resulting n value, V$_{BR}$, $\eta$ (AM-1 light), $\Delta\eta$ (after 1000 hours of AM-1 light irradiation, under AM-1 light), H content in the polycrystalline silicon thin film, and etching rate are shown in Table 7.

TABLE 7

| Sample No. | B1-1 | B1-2 | B1-3 | B1-4 | B1-5 |
|---|---|---|---|---|---|
| Ts (°C.) | 200 | 300 | 400 | 500 | 600 |
| H content in each of n and p layers (atomic %) | 6.4 | 3.0 | 1.5 | 0.4 | 0.03 |
| Etching rate of each of n and p layers (Å/S) | 40 | 23 | 16 | 15 | 15 |
| n | 1.15 | 1.06 | 1.04 | 1.03 | 1.02 |
| V$_{BR}$ | 30 | 30 | 34 | 34 | 37 |
| $\eta$ (%) | 3.8 | 3.2 | 7.3 | 8.0 | 8.1 |
| $\Delta\eta$ (%) | −1.3 | −0.4 | 0 | 0 | 0 |

Samples having H content exceeding 3 atomic % simultaneously with an etching rate exceeding 20 Å/S (i.e. Samples B1-1 and B1-2) exhibit undesirable n value and the photovoltanic efficiency is low, and in addition, the change with lapse of time is large.

EXAMPLE 12

Corning glass substrate 300 provided with an Mo layer prepared in the same manner as in Example 9 was fixed to substrate heating holder 302 on the upper anode side in bell-jar 301, and a polycrystalline silicon plate (not shown: 99.9999%) was placed on the electrode plate of the lower cathode 313 facing the substrate. Bell-jar 301 was evacuated by diffusion pump 309 to 2×10$^{-6}$ Torr. Substrate heating holder 302 was heated to keep the surface temperature of substrate 300 at 480° C. Then, PH$_3$(100)/H$_2$ gas was introduced into the bell-jar through mass-flow meter 306 at 5 SCCM, and Ar/He (5/95, vol. ratio) mixture gas was introduced into bell-jar 301 through 307 at 50 SCCM, and the inner pressure of the bell-jar was set to 0.05 Torr by controlling main valve 310. After the bell-jar inner pressure was stabilized. 1.8 KV was applied to lower cathode electrode 313 by a high frequency power source 314 of 13.56 MHz to cause glow discharge between a polycrystalline silicon plate on cathode 312 and anode (substrate heating holder) 302. RF discharge power (travelling wave power-reflection wave power) was 150 W. Under this condition, there was formed an n+ polycrystalline silicon thin film of 600 Å thick was formed.

On the resulting n+ polycrystalline silicon layer there was deposited an i (intrinsic) type polycrystalline silicon layer of 5000 Å thick by introducing a high purity H$_2$ gas through mass-flow meter 308 (in this case, in place of NH$_3$) at 0.5 SCCM and Ar/He (5/95, vol. ratio) mixture gas through mass-flow meter 307 at 50 SCCM into the bell-jar and effecting deposition under a bell-jar inner pressure of 0.05 Torr and RF power of 150 W.

Then, B$_2$H$_6$(100)/H$_2$ gas was introduced through mass-flow meter 305 at 5 SCCM and Ar/He (5/95, vol. ratio) mixture gas was introduced through mass-flow meter 307 at 50 SCCM and then under the same conditions there was deposited at p+ type polycrystalline silicon layer of 600 Å.

The resulting layer type, hydrogen content and etching rate were: n+ layer, 1.8 atomic % 18; i layer, 0.2 atomic %, 16; p+, 1.8 atomic %, 18.

On the resulting p+ layer at the surface, ITO dot electrode (1 mm$\phi$) was formed in the same manner as in Example 10 to produce a pin junction semiconductor element.

In the case of changing the flow rate of a high purity H$_2$ gas upon producing the i layer in the range of 0–50 SCCM, the hydrogen content, etching rate, diode characteristic and photovoltaic characteristic were as shown in Table 8.

TABLE 8

| Sample No. | B2-1 | B2-2 | B2-3 | B2-4 | B2-5 |
|---|---|---|---|---|---|
| H$_2$ (SCCM) | 0 | 0.1 | 0.5 | 5 | 50 |
| H content in i layer (atomic %) | 0 | 0.01 | 0.2 | 3.2 | 5.5 |
| Etching rate of i layer (Å/S) | 16 | 16 | 16 | 20 | 22 |
| n | 1.21 | 1.03 | 1.03 | 1.05 | 1.13 |
| V$_{BR}$ (V) | 40 | 42 | 40 | 36 | 31 |
| $\eta$ (%) | 1.8 | 7.4 | 8.3 | 7.7 | 2.6 |
| $\Delta\eta$ (%) | 0 | 0 | 0 | 0 | −0.4 |

$\Delta\eta$ is a change in efficiency ($\eta$) after photovoltaic operation for 1000 hours under AM-1 light ($\Delta\eta=\eta(0)-\eta(1000)$; where $\eta(0)$ and $\eta(1000)$ denote the initial efficiency and the efficiency after operation for 1000 hours).

Samples having etching rate of 20 Å/sec or less and H content of 0.01-3 atomic % exhibited good diode characteristic and photovoltaic characteristic.

In a sample containing more than 3 atomic % of hydrogen (B2-5) exhibited, the both characteristics were poor and the change with lapse of time was also large.

A sample of hydrogen content of 0.01 atomic % or less (B2-1) exhibited poor characteristics.

EXAMPLE 13

In a similar manner to Example 10, a pn junction cell was produced at a substrate temperature of 450° C., at a gas flow rate and a gas pressure (Pr) similar to Example 1 and RF power (Po) was changed.

The result is shown in Table 9.

TABLE 9

| Sample No. | B3-1 | B3-2 | B3-3 | B3-4 | B3-5 |
|---|---|---|---|---|---|
| Po (W) | 10 | 20 | 50 | 100 | 150 |
| H content in each of p and n layers (atomic %) | 1.1 | 1.1 | 1.2 | 1.2 | 1.6 |
| Average etching rate of each of p and n layers (Å/S) | 16 | 16 | 16 | 18 | 18 |
| (220) Orientation strength (%) | 85 | 68 | 44 | 29 | 27 |
| n | 1.03 | 1.03 | 1.04 | 1.05 | 1.07 |
| $V_{BR}$ (V) | 35 | 36 | 34 | 33 | 33 |
| $\eta$ (%) | 8.3 | 8.1 | 7.9 | 7.2 | 5.2 |
| $\Delta\eta$ (%) | 0 | 0 | 0 | 0 | −0.05 |

As to the (220) orientation strength, the samples having the orientation strength of 30% or more showed good results.

EXAMPLE 14

Upon producing a pn junction cell in a way similar to Example 10, polycrystalline silicon layers were produced under the same conditions as in Example 9. By changing the growing time of n layer, there were produced pn junction semiconductor elements of 1000, 2000, 3000 and 4000 Å thick (d). The results are shown in Table 10.

TABLE 10

| Sample No. | C4-1 | C4-2 | C4-3 | C4-4 |
|---|---|---|---|---|
| d (Å) | 1,000 | 2,000 | 3,000 | 4,000 |
| H content in a layer (atomic %) | 1.2 | 1.2 | 1.1 | 1.0 |
| Etching rate of n layer (Å/S) | 18 | 18 | 16 | 16 |
| Grain size in n layer (Å) | 180 | 200 | 350 | 500 |
| n | 1.08 | 1.05 | 1.05 | 1.03 |
| $V_{BR}$ | 18 | 27 | 34 | 35 |
| $\eta$ (%) | 4.5 | 6.3 | 7.5 | 8.0 |
| $\Delta\eta$ (%) | −0.2 | 0 | 0 | 0 |

Samples of average grain size of 200 Å or more showed excellent diode characteristics and less change with lapse of time.

EXAMPLE 15

By using an ultra-high vacuum deposition apparatus in FIG. 4, a substrate 400 constituted of a Corning #7059 glass substrate provided with an Mo layer prepared according to the procedure in Example 9 was set to substrate holder 402 in a ultra-high vacuum tank 401 capable of being reduced to $2\times10^{-11}$ Torr.

The tank 401 was evacuated to a pressure of $1\times10^{-11}$ Torr or less, and the substrate temperature was set to 450° C. Then an electron gun 404 (for evaporating silicon) was actuated by an acceleration voltage of 8.5 KV to project the resulting electron beam to a high purity silicon evaporating body 405 simultaneously evaporating phosphorus from a heating crucible 404' (red phosphorus 405' to be evaporated).

The shutter 407 was opened to the direction of A to form an n+ polycrystalline silicon layer of 800 Å thick by controlling with a quartz oscillator thickness meter 406. Then, shutter 407 was closed and the crucible 404' was off, and again shutter 407 was opened to form a polycrystalline silicon layer of 0.4μ thick (Sample C).

On the other hand, on the Corning #7059 glass substrate provided with Mo layer there was formed an n+ layer, and then the vacuum tank 401 was evacuated to $1\times10^{-11}$ Torr or less and a high purity $H_2$ gas (99.9999%) was introduced into the tank 401 through a variable leak valve 408 to set the inner pressure to $1\times10^{-7}$ Torr.

The substrate temperature was similarly set to 450° C. to produce a polycrystalline silicon film of 0.4 μ thick (Sample D). A part of each of Samples C and D was used to measure the H content, maximum surface unevenness of the non-doped layer and the n+ layer. The remainder of each of Samples C and D was used to form an upper electrode by depositing platinum (Pt) of 300 Å thick by vacuum electron beam deposition on the surface.

The resulting Schottky diode cell (Sample C; C5-1; Sample D; D5-2) had the following diode characteristics (n, $V_{BR}$), photovoltaic characteristic ($\eta$, $\Delta$n) shown in Table 11.

TABLE 11

| Sample No. | C/C5-1 | D/D5-1 |
|---|---|---|
| H content in each of non-doped layer and n+ layer (atomic %) | 0 | 0.15 |
| Average etching rate (Å/S) | 16 | 16 |
| n | 1.18 | 1.03 |
| $V_{BR}$ (V) | 32 | 34 |
| $\eta$ (%) | 2.7 | 7.8 |
| $\Delta\eta$ (%) | 0 | 0 |

A sample containing 0.15 atomic % and of an etching rate of 20 Å /sec or less showed good diode characteristics and less change with lapse of time.

EXAMPLE 16

Figure 5:
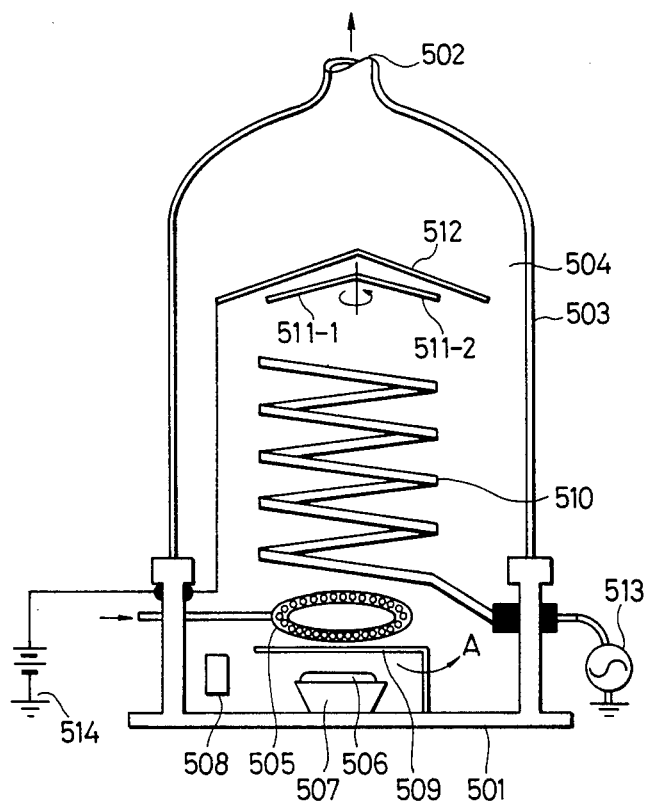
Figure 6:
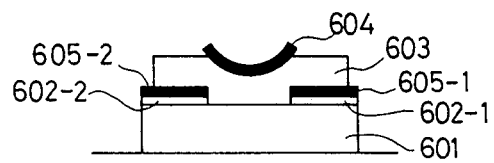

By using an ion-plating deposition apparatus in FIG. 5, a polycrystalline pn junction type field effect transistor in FIG. 6 was produced.

First, in a deposition chamber 503, which can be brought to reduced pressure, there was placed a non-doped polycrystalline silicon body to be evaporated 506 in a boat 507 and a Corning #7059 substrate was set on the supports 511-1 and 511-2. After the deposition chamber was evacuated to a base pressure of about $1\times10^{-7}$ Torr, $B_2H_6(500)/H_2$ gas was introduced through the gas inlet tube 505 into the deposition chamber to a pressure of $5\times10^{-5}$ Torr. The gas inlet tube employed and an inner diameter of 2 mm and shaped at its tip in a loop hving gas blowing openings of 0.5 mm in diameter at intervals of 2 cm.

Then, high frequency of 13.56 MHz was applied to the high frequency coil 510 (5 mm in diameter) to set the output at 60 W, whereby a high frequency plasma atmosphere was formed inside of the coil. On the other hand, while rotating the supports 511-1 and 511-2, the heating device 512 had been brought to the state under actuation and heated to about 470.

As the next step, the evaporating body 506 was irradiated and heated by the electron gun 508, thereby permitting silicon particles to fly. The electron gun had a power of about 0.5 KW.

Thus, a p-type polycrystalline silicon thin film 601 of 5000 Å was formed.

On the resulting p type polycrystalline silicon layer there was formed an n type polycrystalline silicon layer of 800 Å thick under the similar conditions by introducing $PH_3(2500)/H_2$ gas to a pressure of $5\times10^{-5}$ Torr.

Hydrogen content in each of the n type and p type polycrystalline silicon thin film was 0.6 atomic % and etching rate of each of them was 18 Å/sec.

Then, Al electrodes for source 605-1 and drain 605-2 were produced by vacuum deposition and photoetching, and the n layer was also separated with a predetermined width ($10\mu$).

The resulting member was fixed to a heating holder 302 at the anode side in the apparatus of FIG. 3.

In a similar manner to the production of a polycrystalline silicon, the bell-jar was evacuated and the substrate temperature Ts was 250° C., and $NH_3$ gas and $SiH_4(10)/H_2$ gas were introduced each at 5 SCCM through mass-flow meters 308 and 304, respectively, followed by causing a glow discharge at 5 W to produce SiNH film 603 of 2500 Å thick.

Then, an Al layer for gate electrode was deposited, and a gate electrode was formed between source and drain.

The resulting pn junction type field effect transistor (BTA) was an N channel inversion type and was operated very well. The theshold voltage (Vth) of gate was as low as 3 V, and the current at $V_G=20$ V was larger than that at $V_G=0$ by three places or more (ON/OFF ratio).

The effective mobility ($\mu$ eff) of the element was 3.6 (cm$^2$/V·sec), and during the continuous operation at $V_G=V_3=40$ V, there was not observed any change in drain current and threshold voltage at all for 500 hours.

For comparing the above example, (i) there was produced a pn junction type field effect transistor BTB by using Ar gas containing $PH_3$ and Ar gas containing $B_2H_6$ in place of $H_2$ gas containing $PH_3$ and $H_2$ gas containing $B_2H_6$, and (ii) there was produced a pn junction transistor BTC in a similar manner by lowering the substrate temperature from 470° C. to 370° C. to form a p layer and an n layer.

The results are shown in Table 12.

TABLE 12

| Sample | BTA | BTB | BTC |
| --- | --- | --- | --- |
| H content in each of p and n layers (atomic %) | 0.6 | 0 | 1.1 |
| Etching rate of each of p and n layers (Å/S) | 18 | 17 | 23 |
| Vth (V) | 3 | 14 | 6 |
| eff $\left(\dfrac{cm^2}{V \cdot sec}\right)$ | 3.6 | 0.6 | 0.9 |
| ON/OFF ratio ($V_G$:20/0) | $4 \times 10^3$ | $5 \times 10^2$ | $6 \times 10^2$ |
| $\Delta ID$ (%) after 500 hours operation | 0 | 0 | $-7$ |

Sample BTB containing no hydrogen in the polycrystalline silicon thin film of the pn function exhibited a large Vth and small $\mu$eff. Sample BTC of a large etching rate exhibited small $\mu$eff and large change with lapse of time during a continuous operation.

On the contrary, Sample BTA exhibited good characteristics. This means that polycrystal silicon containing a controlled amount of hydrogen and having a controlled etching rate exhibits good characterstics.

EXAMPLE 17

According to the procedure shown below, a polycrystalline silicon thin film was formed on an Mo deposition film on a Corning glass (#7059) and a pn junction element was prepared.

A Corning glass #7059 (120 mm × 120 mm, thickness: 0.7 mm) was lightly etched with a mixture of $HF/HNO_3/CH_3COOH$, washed with running water and dried, and Mo film was formed in the thickness of 1500 Å by electron beam method to prepare a substrate 300. The substrate 300 was fixed in close contact with the substrate heating holder 302 on the upper anode side in a bell-jar deposition chamber 301 as shown in FIG. 3. The bell-jar 301 was evacuated by means of a diffusion pump 309 to a background vacuum degree of $2\times10^{-6}$ Torr, followed by heating of substrate heating holder 302 to maintain the surface temperature of the substrate 300 at 450° C. Subsequently, $SiH_4$ gas diluted to 10 vol.% with $H_2$ gas (abbreviated as "$SiH_4(10)/H_2$") was introduced through a ring-shaped gas blowing inlet 315 at a flow rate of 50 SCCM by use of a mass-flow controller 304 into the bell-jar 301, and also $PH_3(100)/H_2$ gas was introduced into the bell-jar 301 through mass-flow controller 306 at 25 SCCM through the inlet 315, and the inner pressure in the bell-jar was controlled to 0.01 Torr by means of an absolute pressure gage 312 by closing the main valve 310. After the inner pressure in bell-jar 301 was stabilized, a high frequency field of 13.56 MHz was applied to cathode 313 by a power source 314 to excite a glow discharge. The voltage was 0.5 KV, current 48 mA and RF discharge power was 10 W. Thickness of the resulting film was 1000 Å and the fluctuation of the thickness was within ±10% for a substrate for 120 × 120 mm in size when the ring-shaped gas blowing inlet.

Hydrogen content in the film was 0.5 atomic % and the maximum surface unevenness was 200 Å. The etching rate with the above mentioned etchant was 15 Å/sec and this was the same as the etching rate of a silicon wafer of $\rho=0.3$ ohm.cm.

On the resulting n+ type polycrystalline silicon thin film there was formed an n type polycrystalline silicon layer of 5000 Å thick under the same conditions in the same apparatus except that $PH_3(100)/H_2$ and $SiH_4(1)/H_2$ were introduced at 25 SCCM and 50 SCCM, respectively.

Further, on the resulting n type polycrystalline silicon thin film, there was formed a p type polycrystalline silicon thin film of 1000 Å thick in the same apparatus under the same conditions except that $B_2H_6$ gas diluted to 100 vol. ppm with $H_2$ (abbreviated as "$B_2H_6(100)/H_2$") was introduced at 5 SCCM in place of $PH_3$ gas.

Hydrogen content in each of the n type and the p type polycrystalline silicon thin film was 0.5 atomic %.

The maximum surface unevenness of each layer was 200 Å and the etching rate with the above mentioned etchant was 15 Å/sec and the same as that of a silicon wafer of $\rho=0.3$ ohm.cm.

On the p type polycrystalline silicon thin film of the resulting pn junction there was formed an Al dot electrode (vacuum heating deposition, 1 mm$\phi$, 1500 Å thick) to complete a pn junction cell.

From the V-I characteristics between the Al electrode and the Mo electrode, there were observed $n=1.03$, $V_{BR}=35$ V and small Jo. Thus the diode characteristics were excellent.

Even when the V-I was repeatedly measured ($10^4$ times), there was not observed any change in the V-I characteristics at all.

EXAMPLE 18

In the same way as Example 17, on the Mo film on the Corning glass (#7059) there were formed an n type polycrystalline silicon and then a p type one, and then ITO (indium-tin oxide) electrode was formed on the whole surface in the thickness of 2000 Å by sputtering, followed by forming 1 mm$\phi$ dot electrode by photolithography.

The resulting pn junction cell exhibited the same good diode characteristics as that in Example 1. The I-V characteristics were measured by projecting AM-1 (air mass $-1$; ~100 mW/cm$^2$) light from the ITO electrode surface. The results were: Voc=0.59 (V), Jsc=18.9 (mA/cm$^2$), $\eta=8.4\%$.

When the element was operated under AM-1 light for 1000 hours as to the photovoltaic action, there was no change in the V-I characteristics.

EXAMPLE 19

Upon producing a pn junction cell in the same way as in Example 18, the substrate temperature ($T_s$) was changed in the range of 250°–650° C., and RF power was 50 W and gas pressure 0.03 Torr, and the flow rate conditions for $SiH_4(1)/H_2$, $PH_3(100)/H_2$ and $B_2H_6(100/H_2$ were the same as in Example 17.

The resulting pn junction semiconductor element exhibited the n value, $V_{BR}$, $\mu$(under AM-1 light), $\Delta\eta$(AM-1 light irradiation, after 1000 hours, under AM-1 light), H content in each of p and n layers, maximum surface unevenness, and etching rate as shown in Table 13.

TABLE 13

| Sample No. | C1-1 | C1-2 | C1-3 | C1-4 | C1-5 |
| --- | --- | --- | --- | --- | --- |
| Ts (°C.) | 250 | 350 | 450 | 550 | 650 |
| H content in each of p and n layers (atomic %) | 4.8 | 3.6 | 2.5 | 0.5 | 0.02 |
| Maximum surface unevenness of each of p and n layers (Å) | 600 | 400 | 250 | 250 | 200 |
| Etching rate of each of p and n layers (Å/S) | 38 | 22 | 15 | 15 | 15 |
| n | 1.3 | 1.09 | 1.04 | 1.03 | 1.03 |

TABLE 13-continued

| Sample No. | C1-1 | C1-2 | C1-3 | C1-4 | C1-5 |
| --- | --- | --- | --- | --- | --- |
| $V_{BR}$ (V) | 16 | 26 | 33 | 36 | 39 |
| $\eta$ (%) | 3.5 | 4.8 | 7.9 | 8.2 | 8.6 |
| $\Delta\eta$ (%) | −0.4 | −0.3 | 0 | 0 | 0 |

Samples of hydrogen content of more than 3 atomic % and etching rate of 20 Å/S or more (Samples C1-1 and C1-2) showed poor n value, low efficiency of photovoltaic power and large change with the lapse of time.

EXAMPLE 20

Repeating the procedures of Example 19 except that the substrate temperature was 450° C., RF power was 100 W and 200 W, there were produced pn junction semiconductor elements. The results are shown in Table 14.

TABLE 14

| Sample No. | C4-1 | C4-2 | C4-3 | C4-4 |
| --- | --- | --- | --- | --- |
| RF power (W) | 50 | 100 | 150 | 200 |
| H content in each of p and n layers (atomic %) | 2.5 | 2.4 | 2.5 | 2.7 |
| Maximum surface unevenness of each of p and n layers (Å) | 250 | 300 | 400 | 400 |
| Etching rate of each of p and n layers (Å/S) | 15 | 17 | 18 | 21 |
| Orientation strength of each of p and n layers (%) | 53 | 38 | 29 | 26 |
| n | 1.04 | 1.04 | 1.05 | 1.08 |
| $V_{BR}$ (V) | 33 | 29 | 28 | 26 |
| $\eta$ (%) | 7.9 | 6.7 | 5.1 | 4.0 |
| $\Delta\eta$ (%) | 0 | 0 | 0 | −0.2 |

Sample of etching rate of 20 Å/S or higher (C4-4) exhibited poor n value, $\eta$, $\Delta$n.

Samples of orientation strength of 30% or more of each of p and n layers (C4-1, C4-2) exhibited good characteristics.

EXAMPLE 21

Upon producing pn junction cells following the procedures of Example 18, the conditions were the temperature (Ts)=450° C., RF power 50 W, flow rate conditions of $SiH_4(10)/H_2$, $PH_3(100)/H_2$ and $B_2H_6(100)/H_2$ being the same as in Example 17.

The gas pressure was varied. The results are shown in Table 15.

TABLE 15

| Sample No. | C5-1 | C5-2 | C5-3 | C5-4 | C5-5 |
| --- | --- | --- | --- | --- | --- |
| Pr (Torr) | 0.01 | 0.02 | 0.04 | 0.08 | 0.1 |
| H content (atomic %) | 2.4 | 2.4 | 2.5 | 2.5 | 2.7 |
| Maximum surface unevenness (Å) | 200 | 250 | 350 | 750 | 900 |
| Etching rate (Å/S) | 16 | 16 | 16 | 18 | 19 |
| n | 1.03 | 1.03 | 1.03 | 1.04 | 1.06 |
| $V_{BR}$ (V) | 40 | 32 | 30 | 18 | 8 |
| $\eta$ (%) | 8.0 | 8.0 | 7.1 | 6.5 | 3.8 |
| $\Delta\eta$ (%) | 0 | 0 | 0 | 0 | −0.2 |

Sample of maximum surface unevenness exceeding 800 Å (C5-5) exhibited poor n value, remarkably low $V_{BR}$ and large change with lapse of time.

EXAMPLE 22

A substrate 400 constituted of a Corning #7059 glass provided with an Mo layer prepared similarly as in Example 17 was mounted on substrate holder 402 in an ultra-high vacuum tank 401 capable of being reduced to $2\times10^{-11}$ Torr. After reducing the pressure to $5\times10^{-11}$ Torr or less, the substrate temperature was made to 400° C. by a tantalum heater 403. Then electron gun 404 (for evaporating silicon) was actuated by an acceleration voltage of 8 KV and the resulting electron beam was projected to a high purity silicon evaporating body 405 simultaneously evaporatings phosphorus from a heating crucible 404' (for evaporating red phosphorus 405'), and shutter 407 was opened to the direction of A to form an n+ polycrystalline silicon layer of 1000 Å thick by controlling with a quartz oscillator thickness meter 406.

Then shutter 407 was closed, the crucible was made off, and again shutter 407 was opened to for a polycrystalline silicon layer of $0.5\mu$ thick. The pressure during the deposition was $1\times10^{-9}$ Torr and the deposition rate was 1.4 Å/sec (Sample E).

On the other hand, after forming an n+ layer on a Corning #7059 glass substrate provided with an Mo layer, the vacuum tank 401 was evacuated to a pressure of $5\times10^{-11}$ Torr or less and than a high purity hydrogen gas (99.9999%) was introduced into the vacuum tank 401 by a variable leak valve 408 and the pressure in the tank was set to $5\times10^{-7}$ Torr. The substrate temperature was set to 400° C. and the film forming rate was controlled to 1.4 Å/sec, and in the similar manner, a polycrystalline silicon film of $0.5\mu$ thick was produced (Sample F).

A part of the film was used for measuring the hydrogen content, maximum surface unevenness, and etching rate while the remainder of the film was used and platinum (Pt) of 300 Å was formed on the surface of each of Samples E and F by vacuum electron beam deposition to produce an upper electrode.

The resulting Schottky diode cells (Sample E: C6-1, Sample F: C6-2) exhibited diode characteristics (n; $V_{BR}$) and photovoltaic characteristics ($\eta$, $\Delta\eta$) as shown in Table 16.

TABLE 16

| Sample No. | E/C6-1 | F/C6-2 |
| --- | --- | --- |
| H content (atomic %) | <0.01 | 0.2 |
| Maximum surface unevenness (Å) | 250 | 250 |
| Etching rate (Å/S) | 15 | 15 |
| n | 1.23 | 1.03 |
| $V_{BR}$ (V) | 37 | 38 |
| $\eta$ (%) | 2.9 | 8.4 |
| $\Delta\eta$ (%) | 0 | 0 |

As shown in Table 16. A sample containing little hydrogen (C6-1) exhibited a large n value, poor photovoltaic characteristics while a sample containing 0.2 atomic % of hydrogen (C6-2) was good.

EXAMPLE 23

A Corning glass substrate 300 having thereon an Mo layer which was prepared similarly to Example 17 was fixed in close contact with a substrate heating holder 302 at the anode side in the bell-jar 301, and a polycrystalline silicon plate (not shown; purity 99.9999%) was placed on the electrode plate of the lower cathode 313 so as to be opposed to the substrate. The bell-jar 301 was evacuated by means of the diffusion pump 309 to $1\times10^{-6}$ Torr. The surface temperature of the substrate 300 was maintained at 500° C. by heating of the substrate heating holder 302. Subsequently, $PH_3(100)/H_2$ gas was introduced into the bell-jar 301 while controlling its flow rate through a mass flowmeter 306 to 5 SCCM, and further a gas mixture of Ar/He (ratio of 5/95) was introduced into the bell-jar 301 while controlling its flow rate through a mass flowmeter 307 to 50 SCCM, followed by narrowing of the main valve 310 to set the inner pressure in the bell-jar at 0.03 Torr.

After the inner pressure in the bell-jar was stabilized, a voltage of 1.4 KV was applied to the lower cathode 313 by the high frequency power source 314 of 13.56 MHz to give rise to glow discharging between the polycrystalline silicon plate on the cathode 312 and the anode (substrate heating holder) 302. The RF discharging power (travelling wave power-reflection wave power) was 95 W. Under this condition, an n+ polycrystalline silicon thin film of 600 Å was formed.

On the n+ polycrystalline silicon layer thus formed, an i (intrinsic) type polycrystalline layer of 5000 Å was further formed in such a manner that a high purity $H_2$ gas was introduced into the bell-jar while controlling its flow rate to 0.5 SCCM through a mass flowmeter 308 (here, $H_2$ flows in place of $NH_3$) and a gas mixture of Ar/He (5/65 ratio by volume) was also introduced while controlling its flow rate to 50 SCCM through a mass flowmeter 307 and under the conditions that the inner pressure in the bell-jar was 0.03 Torr and RF power 95 W. Subsequently, $B_2H_6(100)/H_2$ gas and gas mixture of Ar/He (5/65 ratio by volume) were introduced into the bell-jar at flow rates of 5 SCCM and 50 SCCM, respectively, through mass flowmeters 305 and 307, and thereafter, under the same conditions, a p+ type polycrystalline silicon layer of 600 Å thickness was further formed.

The hydrogen content, maximum of surface unevenness and etching rate for the n+ layer, i layer and p+ layer thus formed were as follows: 1.6 atomic %, 250 Å and 17 Å/sec for the n+ layer; 0.1 atomic %, 350 Å and 15 Å/sec for the i layer; 1.6 atomic %, 250 Å and 17 Å/sec for the p+ layer.

Subsequently, an ITO dot electrode of 1 mm in diameter was formed on the p+ layer surface in the same manner as in Example 18 to obtain a pin junction semiconductor element.

Table 17 shows the average grain size and pn junction characteristic of the i type polycrystalline silicon thin film when the RF power (Po) at the time of forming that thin film and film thickness (d) were varied.

TABLE 17

| Sample No. | C7-1 | C7-2 | C7-3 | C7-4 |
| --- | --- | --- | --- | --- |
| RF power (W) | 95 | 95 | 150 | 150 |
| Thickness of i layer (Å) | 5,000 | 2,000 | 5,000 | 2,000 |
| H content in i layer (atomic %) | 0.1 | 0.1 | 0.8 | 0.9 |
| Maximum surface unevenness of i layer (Å) | 350 | 300 | 400 | 300 |
| Etching rate of i layer (Å/S) | 15 | 16 | 17 | 17 |
| Average grain size of i layer (Å) | 600 | 450 | 450 | 200 |
| n | 1.04 | 1.05 | 1.05 | 1.07 |
| $V_{BR}$ (V) | 40 | 31 | 38 | 19 |
| $\eta$ (%) | 8.8 | 8.0 | 7.6 | 5.0 |
| $\Delta\eta$ (%) | 0 | 0 | 0 | 0 |

The data in that table show that the polycrystalline silicon films having average grain size of 200 Å or more can give elements with superior diode characteristics.

EXAMPLE 24

In this example, a polycrystalline silicon pn junction type field effect transistor as shown in FIG. 6 was prepared by using an ion-plating deposition device as shown in FIG. 5.

First, in a deposition chamber 503 which can be brought to reduced pressure, there was placed a non-doped polycrystalline body 506 to be evaporated in a boat 507, and Corning #7059 substrate was placed on the supports 511-1 and 511-2. After the deposition chamber 503 was evacuated to a base pressure of about $1 \times 10^{-7}$ Torr, $B_2H_6(500)/H_2$ gas was introduced through the gas introducing tube 505 into the deposition chamber so that the partial pressure of the hydrogen gas, $P_H$ might be $1.5 \times 10^{-5}$ Torr. The gas introducing tube 505 employed had an inner diameter of 2 mm and shaped at its tip in a loop having gas blowing openings of 0.5 mm at intervals of 2 cm.

Then, high frequency of 13.56 MHz was applied to the high frequency coil 510 (5 mm in diameter) to set the output at 40 W so that a high frequency plasma atmosphere was formed in the inside portion of the coil.

On the other hand, while rotating the supports 511-1 and 511-2, the heating device 512 was brought to the state for actuation and heated to about 500° C.

As the next step, the evaporating body 506 was irradiated with the electron gun 508 to allow heated silicon particles to fly. At that tims, the power of the electron gun was about 0.25 KW. In the above manner, a p type polycrystalline thin film 601 having a thickness of 5000 Å was formed.

Under similar conditions, $PH_3(2500)/H_2$ gas was introduced into the deposition chamber so that the pressure might be $1.5 \times 10^{-5}$ Torr to form an n type polycrystalline layer having a thickness of 800 Å on the p type polycrystalline thin film. The hydrogen content in each of the n type and p type polycrystalline silicon thin films were 0.3 atomic %. The maximum of the surface unevenness was 400 Å and the etching rate was 17 Å/sec in either case.

Subsequently, Al electrodes for the source 605-1 and drain 605-2 were formed through the steps of vacuum deposition-photoetching, and at the same time, the n layer was separated with a predetermined width (10μ). Thereafter, the structure thus obtained was fixed to the heating holder 302 at the anode side in the device as shown in FIG. 3. Similarly to the case of forming the polycrystalline silicon film, the bell-jar 301 was evacuated, and the substrate temperature (Ts) was controlled to 250° C. Then, $NH_3$ gas and $SiH_4(10)/H_2$ gas were introduced at the respective flow rates of 20 SCCM and 5 SCCM into the bell-jar through the mass flow meters 308 and 304. Glow discharging was caused with the power of 5 W to thereby form an SiNH film 603 to a thickness of 2500 Å.

Subsequently, an Al layer for gate electrode was formed by the deposition and photoetched to form a gate electrode between the source and drain. The pn junction type field effect transistor (CTA) was of an N channel inversion type and the performance was good. The threshold voltage (Vth) of the gate was as low as 2 V, and the current at $V_G=20$ V was larger than the current at $V_G=0$ by three places or more (ON/OFF ratio). The effective mobility (μeff) of this element was 4.3 (cm²/V.sec), and no change in the drain current and threshold voltage was observed during continuous actuation under the conditions of $V_G=V_D=40$ V for 500 hours.

For comparison with this example, Table 18 shows characteristics of a pn junction type field effect transistor (CTB) which was prepared similarly to this example, but by using an Ar gas containing $PH_3$ and Ar gas containing $B_2H_6$ in place of the $H_2$ gas containing $PH_3$ and $H_2$ gas containing $B_2H_6$, those of a pn junction type field effect transistor (CTC) which was obtained similarly, but by using a $H_2$ gas containing $PH_3$ and $H_2$ gas containing $B_2H_6$ and raising the power of electron gun to 0.8 KW, and those of a pn junction type field effect transistor (CTD) which was prepared similarly, but by using laminated film of a p layer and n layer formed under the condition that the substrate temperature was decreased from 500° C. to 400° C.

TABLE 18

| Sample No. | CTA | CTB | CTC | CTD |
|---|---|---|---|---|
| H content in each of p and n layers (atomic %) | 0.3 | 0 | 0.5 | 1.9 |
| Maximum surface unevenness (Å) of each of p and n layers | 400 | 500 | 1,000 | 450 |
| Etching rate of each of p and n layers (Å/sec) | 17 | 17 | 19 | 23 |
| Vth | 2 | 10 | 7 | 5 |
| μeff $\left(\frac{cm^2}{V \cdot S}\right)$ | 4.3 | 0.8 | 1.1 | 0.8 |
| ON/OFF ratio ($V_G$20/0) | $5 \times 10^3$ | $8 \times 10^2$ | $8 \times 10^2$ | $6 \times 10^2$ |
| ΔIo (%) after 500 hours | 0 | 0 | −7 | −4 |

Sample CTB containing no hydrogen in each of the p and n polycrystalline silicon thin films is poor in the Vth, μeff and ON/OFF ratio. Sample CTC having a larger maximum of the surface unevenness is inferior in any characteristics including the change with lapse of time. Further, Sample CTD, the p and n layers of which had a higher etching rate, is also poor in the characteristics.

What we claim is:

1. A semiconductor device comprising, in sequence, a substrate, a polycrystalline silicon thin film on the substrate having a semiconductor junction formed by an interface of a first polycrystalline layer having a first type of electroconductivity and a second polycrystalline layer having a second type of electroconductivity, wherein the film surface at the interface has an uneveness substantially not more than 800 Å at its maximum and wherein the layers constituting the film each contain from about 0.01 to 3 atomic percent of hydrogen.

2. A semiconductor device comprising, in sequence, a substrate, a polycrystalline silicon thin film on the substrate having a semiconductor junction formed by an interface of a first polycrystalline layer having a first type of electroconductivity and a second polycrystalline layer having a second type of electroconductivity, wherein the etching rate of the layers constituting the film are each 20 Å/sec or less by etching with an etchant comprising a mixture of 50 volume percent of an aqueous solution of hydrofluoric acid and glacial acetic acid at a mixing ratio by volume of 1:3:6 and wherein the layers constituting the film each contain from about 0.01 to 3 atomic percent of hydrogen.

3. A semiconductor element according to claim 1 in which the first polycrystalline silicon thin film layer has a diffraction pattern of which the diffraction strength at the (220) plane is 30% or more based on the total diffraction strength.

4. A semiconductor element according to claim 2 in which the first polycrystalline silicon thin film layer has a diffraction pattern of which the diffraction strength at the (220) plane is 30% or more based on the total diffraction strength.

5. A semiconductor element according to claim 1 in which the average crystal grain size of the first polycrystalline silicon thin film layer is 200 Å or more.

6. A semiconductor element according to claim 2 in which the average crystal grain size of the first polycrystalline silicon thin film layer is 200 Å or more.

7. The semiconductor element according to claim 1 in which the substrate is glass.

8. The semiconductor element according to claim 2 in which the substrate is glass.

* * * * *

UNITED STATES PATENT AND TRADEMARK OFFICE
CERTIFICATE OF CORRECTION

PATENT NO. : 4,719,501            Page 1 of 3
DATED : January 12, 1988
INVENTOR(S) : KATSUMI NAKAGAWA, ET AL.

It is certified that error appears in the above-identified patent and that said Letters Patent is hereby corrected as shown below:

COLUMN 1

Line 37, "device improved" should read --device with improved--.

COLUMN 4

Line 53, "by the" should read --by (1) the--.
    Line 56, "exciting, a" should read --exciting, (2) a--.
    Line 57, "cells, efficiency" should read --cells, (3) efficiency--.
    Line 58, "($\eta$), the" should read --($\eta$), (4) the--.
    Line 64, "of such" should read --of each such--.

COLUMN 5

Line 9, "characteristics time," should read --characteristics upon the passage of time,--.

COLUMN 8

Line 4, "(55/241)X100$\neq$22.8 (%)." should read --(55/241)X100$\approx$22.8 (%).--.

COLUMN 9

Line 20, "350° C.)." should read --350° C. to 500° C.).--.

COLUMN 10

Line 46, "bell-jar 31" should read --bell-jar 301--.

UNITED STATES PATENT AND TRADEMARK OFFICE
CERTIFICATE OF CORRECTION

PATENT NO. : 4,719,501
DATED : January 12, 1988
INVENTOR(S) : KATSUMI NAKAGAWA, ET AL.

It is certified that error appears in the above-identified patent and that said Letters Patent is hereby corrected as shown below:

COLUMN 12

Line 11, "2,8 atomic %," should read --2.8 atomic %,--.

COLUMN 14

Line 20, "0.5μ this" should read --0.5μ thick--.
Line 26, "(99,9999%)" should read --(99.9999%)--.

COLUMN 16

Line 47, ""SIH$_4$(3)/H$_2$"" should read --"SiH$_4$(3)/H$_2$"--.

COLUMN 17

Line 14, "1 mm φt," should read --1 mm φ,--.

COLUMN 18

Line 20, "through 307" should read --through mass-flow meter 307--.

COLUMN 20

Table 11, "D/D5-1" should read --D/D5-2--.

COLUMN 21

Line 10, "470." should read --470° C.--.
Line 49, "$V_G=V_3=40$ V," should read --$V_G=V_D=40$ V,--.

UNITED STATES PATENT AND TRADEMARK OFFICE
CERTIFICATE OF CORRECTION

PATENT NO. : 4,719,501

DATED : January 12, 1988

INVENTOR(S) : KATSUMI NAKAGAWA, ET AL.

Page 3 of 3

It is certified that error appears in the above-identified patent and that said Letters Patent is hereby corrected as shown below:

COLUMN 28

Lines 55-56, "uneveness" should read --unevenness--.

Signed and Sealed this

Second Day of August, 1988

Attest:

DONALD J. QUIGG

Attesting Officer

Commissioner of Patents and Trademarks